United States Patent
Brenninger et al.

(10) Patent No.: US 10,240,235 B2
(45) Date of Patent: Mar. 26, 2019

(54) METHOD AND APPARATUS FOR DEPOSITING A MATERIAL LAYER ORIGINATING FROM PROCESS GAS ON A SUBSTRATE WAFER

(75) Inventors: Georg Brenninger, Oberbergkirchen (DE); Alois Aigner, Marktl (DE); Christian Hager, Kastl (DE)

(73) Assignee: SILTRONIC AG, Munich (DE)

( * ) Notice: Subject to any disclaimer, the term of this patent is extended or adjusted under 35 U.S.C. 154(b) by 1414 days.

(21) Appl. No.: 13/407,832

(22) Filed: Feb. 29, 2012

(65) Prior Publication Data

US 2012/0263875 A1   Oct. 18, 2012

(30) Foreign Application Priority Data

Apr. 18, 2011   (DE) .................. 10 2011 007 632

(51) Int. Cl.
| | |
|---|---|
| C23C 16/44 | (2006.01) |
| H01L 21/67 | (2006.01) |
| C23C 16/458 | (2006.01) |
| H01L 21/687 | (2006.01) |

(52) U.S. Cl.
CPC ...... *C23C 16/4585* (2013.01); *C23C 16/4401* (2013.01); *H01L 21/6719* (2013.01); *H01L 21/68735* (2013.01)

(58) Field of Classification Search
CPC . C23C 14/50; C23C 16/4401; C23C 16/4409; C23C 16/4585; H01L 21/67098; H01L 21/67109; H01L 21/67115; H01L 21/6719; H01L 21/68714; H01L 21/68735; H01L 21/68742; H01L 21/68764; H01L 21/68785; H01L 21/68792
See application file for complete search history.

(56) References Cited

U.S. PATENT DOCUMENTS

| | | | |
|---|---|---|---|
| 5,304,248 A * | 4/1994 | Cheng et al. | 118/728 |
| 6,254,686 B1 | 7/2001 | Comita et al. | |
| 6,344,631 B1 | 2/2002 | Chacin | |
| 7,942,969 B2 * | 5/2011 | Riker et al. | 118/715 |
| 2002/0007797 A1 | 1/2002 | Stevens et al. | |
| 2005/0106524 A1* | 5/2005 | Ose | 432/247 |
| 2008/0092821 A1 | 4/2008 | Otsuka et al. | |

(Continued)

FOREIGN PATENT DOCUMENTS

| | | |
|---|---|---|
| CN | 1529900 A | 9/2004 |
| JP | 2002-141294 A1 | 5/2002 |

(Continued)

*Primary Examiner* — Benjamin Kendall
(74) *Attorney, Agent, or Firm* — Brooks Kushman P.C.

(57) ABSTRACT

An apparatus for depositing a material layer originating from process gas on a substrate wafer, contains:
- a reactor chamber delimited by an upper dome, a lower dome, and a side wall;
- a susceptor for holding the substrate wafer during the deposition of the material layer;
- a preheating ring surrounding the susceptor;
- a liner, on which the preheating ring is supported in a centered position wherein a gap having a uniform width is present between the preheating ring and the susceptor; and
- a spacer acting between the liner and the preheating ring, the spacer keeping the preheating ring in the centered position and providing a distance Δ between the preheating ring and the liner.

16 Claims, 6 Drawing Sheets

(56) References Cited

U.S. PATENT DOCUMENTS

| | | | | |
|---|---|---|---|---|
| 2009/0272719 A1* | 11/2009 | Collins | ................ | C30B 25/12 |
| | | | | 216/58 |
| 2009/0283036 A1* | 11/2009 | Duong | ............... | C23C 16/4401 |
| | | | | 118/500 |
| 2010/0122655 A1* | 5/2010 | Tiner et al. | ................... | 118/504 |
| 2011/0168330 A1* | 7/2011 | Sakaue | ............ | H01L 21/67109 |
| | | | | 156/345.31 |

FOREIGN PATENT DOCUMENTS

| | | | |
|---|---|---|---|
| JP | 2003142411 A | | 5/2003 |
| JP | 2003-218039 A | | 7/2003 |
| JP | 2006049503 A | | 2/2006 |
| JP | 2006-66432 A | | 3/2006 |
| KR | 1998-081271 A | | 11/1998 |
| KR | 2007003172 A | * | 1/2007 |
| TW | I258189 | | 1/1992 |
| WO | 2007050309 A1 | | 5/2007 |

* cited by examiner

METHOD AND APPARATUS FOR DEPOSITING A MATERIAL LAYER ORIGINATING FROM PROCESS GAS ON A SUBSTRATE WAFER

CROSS-REFERENCE TO RELATED APPLICATIONS

This application claims priority to German Patent Application No. DE 102011007632.8 filed Apr. 18, 2011 which is herein incorporated by reference.

BACKGROUND OF THE INVENTION

1. Field of the Invention

The invention relates to an apparatus for depositing a material layer originating from process gas on a substrate wafer, and to a method which uses said apparatus.

2. Background Art

The invention relates, in particular, to an apparatus for depositing a material layer by chemical vapor deposition (CVD), for example an apparatus for depositing an epitaxial layer on a substrate wafer composed of a semiconductor material such as silicon.

The basic construction of an apparatus for depositing a material layer originating from process gas on a substrate wafer is known and is evident, for example, from the description in WO 2007/050309 A1. Accordingly, such an apparatus comprises a reactor chamber, which is delimited by an upper dome, a lower dome and a side wall. Radiant heating systems are arranged above and below the reactor chamber and, during the deposition of a material film, generate enough heat in order that process gas directed over the substrate wafer is activated and a material layer emerging from constituents of the process gas forms on the surface of the substrate wafer. The substrate wafer is held by a susceptor surrounded by a preheating ring. The preheating ring lies on a liner, which is part of the side wall of the reactor chamber. It has the function of supporting the heating of process gas which is directed to the substrate wafer. Integrated into the side wall are feed and outlet openings for feeding in the process gas and for discharging waste gases emerging therefrom.

JP2006049503 A2 discusses an apparatus used for depositing an epitaxial film on a semiconductor wafer composed of silicon. The apparatus has the basic construction described above and furthermore has further feed and outlet openings integrated into the side wall of the reactor chamber. The further feed and outlet openings serve for feeding purging gas into that volume of the reactor chamber which is present below the susceptor, and for discharging the purging gas from this volume. In accordance with the description in JP2006049503 A2, gaseous compounds can pass through the gap between the preheating ring and the susceptor to the growing epitaxial layer and alter the resistivity of the epitaxial layer in the edge region of the semiconductor wafer. In order to prevent this "autodoping" effect, JP2006049503 A2 proposes covering the gap.

The inventors of the present invention have found that it is necessary to deal with certain problems when using an apparatus configured, in principle, like the apparatus described in WO 2007/050309 A1 or as described in JP2006049503 A2. This is because there is the risk that the radial profile of the resistivity of an epitaxially deposited layer composed of silicon, as considered over the diameter of the substrate wafer, will become markedly asymmetrical. Ideally, the profile is symmetrical or at least almost symmetrical. Furthermore, it is expected that particles will contaminate the deposited material layer to a comparatively high extent.

SUMMARY OF THE INVENTION

Therefore, an object of the invention was to provide a solution that avoids the problems described. These and other objects are achieved by means of an apparatus for depositing a material layer originating from process gas on a substrate wafer, the apparatus comprising a reactor chamber, which is delimited by an upper dome and a lower dome and a side wall;

a susceptor for holding the substrate wafer during deposition of the material layer;

a preheating ring surrounding the susceptor;

a liner, on which the preheating ring is supported in a centered position in which a gap having a uniform width is present between the preheating ring and the susceptor; and a spacer acting between the liner and the preheating ring, said spacer keeping the preheating ring in the centered position and producing a distance Δ between the preheating ring and the liner.

DETAILED DESCRIPTION OF THE PREFERRED EMBODIMENT(S)

In the present invention, the susceptor and the substrate wafer are rotated about their center during the deposition of a material layer on the substrate wafer. The preheating ring, which is not subjected to this rotary movement, should remain in a centered position in the meantime. The inventors have surprisingly and unexpectedly discovered that the problems previously described are caused by virtue of the fact that the preheating ring leaves the centered position, which it has assumed at the beginning of the deposition process, in an uncontrolled manner during the course of the process. The reason for this is a relative radial movement between the preheating ring and the liner to thermal expansion, which is attributable to different thermal expansion properties of the material of the preheating ring and of the liner.

The displacement of the preheating ring on the liner has the effect, firstly, that the width of the gap between the preheating ring and the susceptor does not remain uniform, as is the case if the preheating ring remained in the centered position. The width of the gap starts to fluctuate along the periphery of the susceptor during the course of the deposition process. The "autodoping" effect is intensified where the gap is wider, because at these locations more gas can pass through the gap to the growing material layer.

The displacement of the preheating ring on the liner has the effect, secondly, that particles arise on account of friction and pass onto the deposited material layer and contaminate the latter. The displacement of the preheating ring can even have the effect that the preheating ring and the susceptor touch one another, which augments the intensity of particle formation. For this reason, care is taken to ensure that the gap between the preheating ring and the susceptor has a width of at least 2 mm. However, such a width of the gap promotes the "autodoping" effect previously described.

In order to avoid these problems, the claimed apparatus has a spacer acting between the liner and the preheating ring, the spacer keeping the preheating ring in the centered position independently of its thermal expansion and independently of the thermal expansion of the liner and producing a distance Δ between the preheating ring and the liner. In this way, direct contact between the preheating ring and the liner is completely or almost completely prevented. Owing to the lack of contact, a relative radial movement between the preheating ring and the liner due to thermal expansion during the deposition of the material film no longer contributes to the formation of particles.

The susceptor and the preheating ring of the apparatus preferably consists of a material described as suitable therefor in WO 2007/050309 A1, most preferably of silicon carbide. The preheating ring preferably has a form described as suitable for it in WO 2007/050309 A1. Both these publications are incorporated herein by reference.

The upper and lower domes of the apparatus and also the liner consists of a material that is transmissive to IR radiation, preferably of quartz.

In accordance with one embodiment of the invention, the spacer is formed by suitable shaping of the preheating ring and of the liner. Such shaping can consist, for example, in the preheating ring having wedge-shaped projections that become located in grooves of the liner, wherein the opening angles of the projections are greater than those of the grooves.

In accordance with one preferred embodiment of the invention, the spacer is formed by sliding balls that fix the preheating ring in the centered position and at a specific distance above the liner. The invention is explained in greater detail below on the basis of the example of this embodiment and with reference to the figures.

Figure 1:
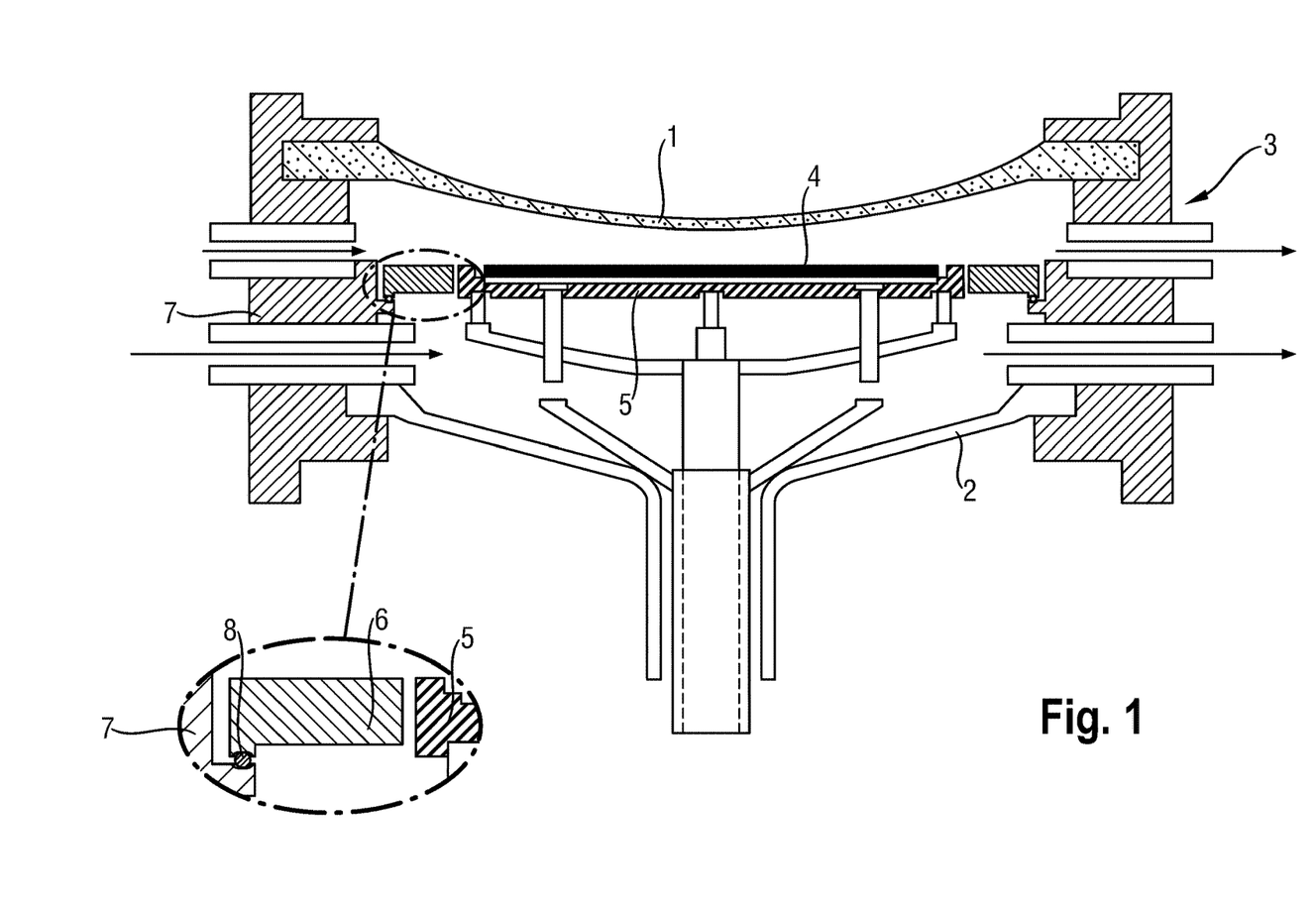
FIG. 1 shows a reactor chamber equipped with features according to the invention.

FIG. 1 shows a reactor chamber having the typical features of an apparatus for depositing a material layer originating from process gas on a substrate wafer and comprising features according to the invention. The features illustrated include an upper dome 1, a lower dome 2 and a side wall 3. The substrate wafer 4 is held by a susceptor 5 surrounded by a preheating ring 6. The preheating ring 6 lies on a liner 7, which is part of the side wall 3 of the reactor chamber. Sliding balls 8 distributed over the edge region of the preheating ring function as a spacer between the preheating ring 6 and the liner 7. The sliding balls preferably consist of silicon carbide and their number is preferably 3 to 8, particularly preferably 4.

Figure 2:
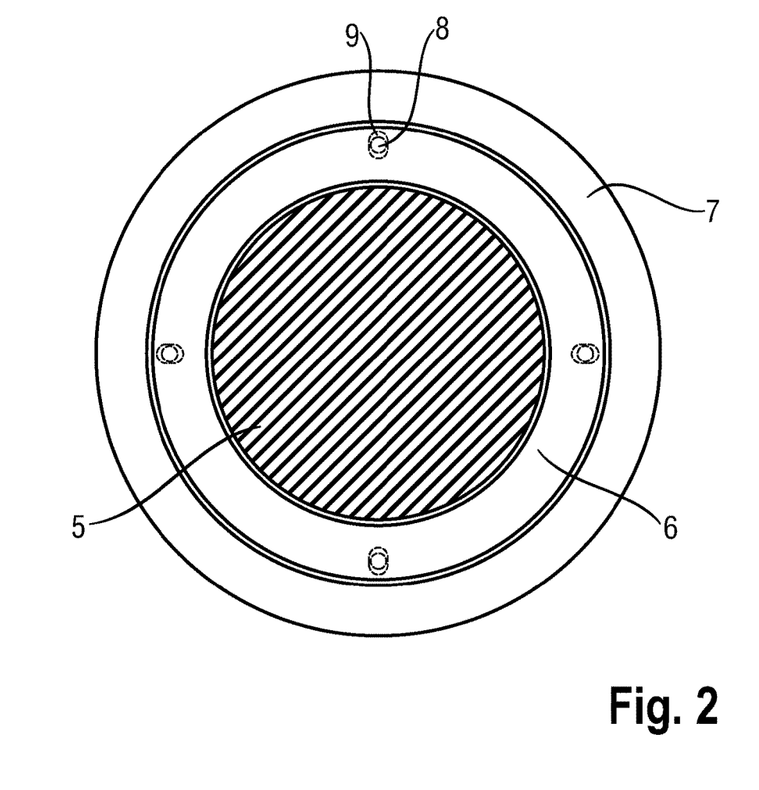
FIG. 2 shows a plan view of a susceptor, a preheating ring and a liner.

FIG. 2 shows a plan view of the susceptor 5, the preheating ring 6 and the liner 7 and, in addition, the position of four sliding balls 8 distributed on the circumference of the preheating ring 6.

Figure 3:
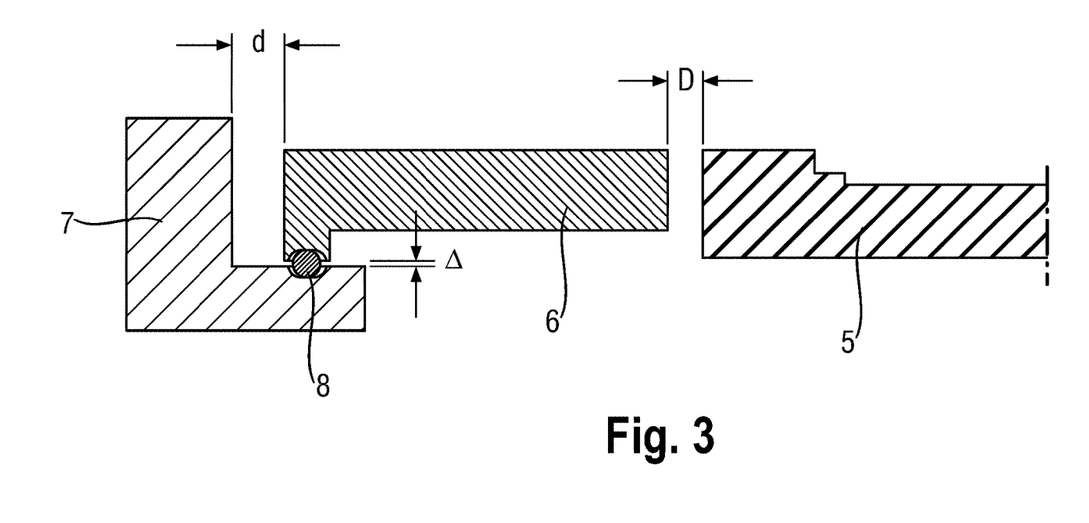
FIG. 3 is a detail view demonstrating features according to the invention.

As is evident from FIG. 3, the sliding balls 8 are partly embedded in the preheating ring 6 and in the liner 7. The sliding balls 8 in each case lie in a radially extending elongated hole 9, as a result of which the preheating ring 6 is kept in the centered position independently of its own thermal expansion and independently of the thermal expansion of the liner 7 and has no contact with the liner 7 arranged underneath.

The distance Δ between the preheating ring 6 and the liner 7 in the region adjoining the sliding balls 8 is preferably not less than 0.01 mm and not more than 2 mm. If the distance is smaller, the risk of particles arising on account of friction increases. If the distance is larger, the risk increases that gas from the volume below the susceptor will cause "autodoping" and/or deposit on the reactor wall.

In order to counteract the "autodoping" effect, the gap D between the preheating ring 6 and the susceptor 5 has a uniform width of preferably not less than 0.1 mm and not more than 2 mm, more preferably not more than 1 mm. If the gap D is smaller than 0.1 mm, the preheating ring 6 could touch the susceptor 5 on account of thermal expansion. If the gap D is larger than 2 mm, a significant "autodoping" effect should be expected.

The distance d between an outer lateral boundary of the preheating ring 6 and—lying opposite said boundary—an inner lateral boundary of the liner 7 is preferably not less than 0.1 mm and not more than 1.9 mm. If the gap is smaller, the risk increases that the liner 7 and the preheating ring 6 will touch one another on account of thermal expansion.

EXAMPLE AND COMPARATIVE EXAMPLE

The advantageous effect of the invention is evident if properties such as the radial profile of the resistivity of the deposited layer or the number of particles detected on the deposited layer are compared in the case of semiconductor wafers composed of silicon which are provided with an epitaxially deposited layer composed of silicon.

Figure 4:
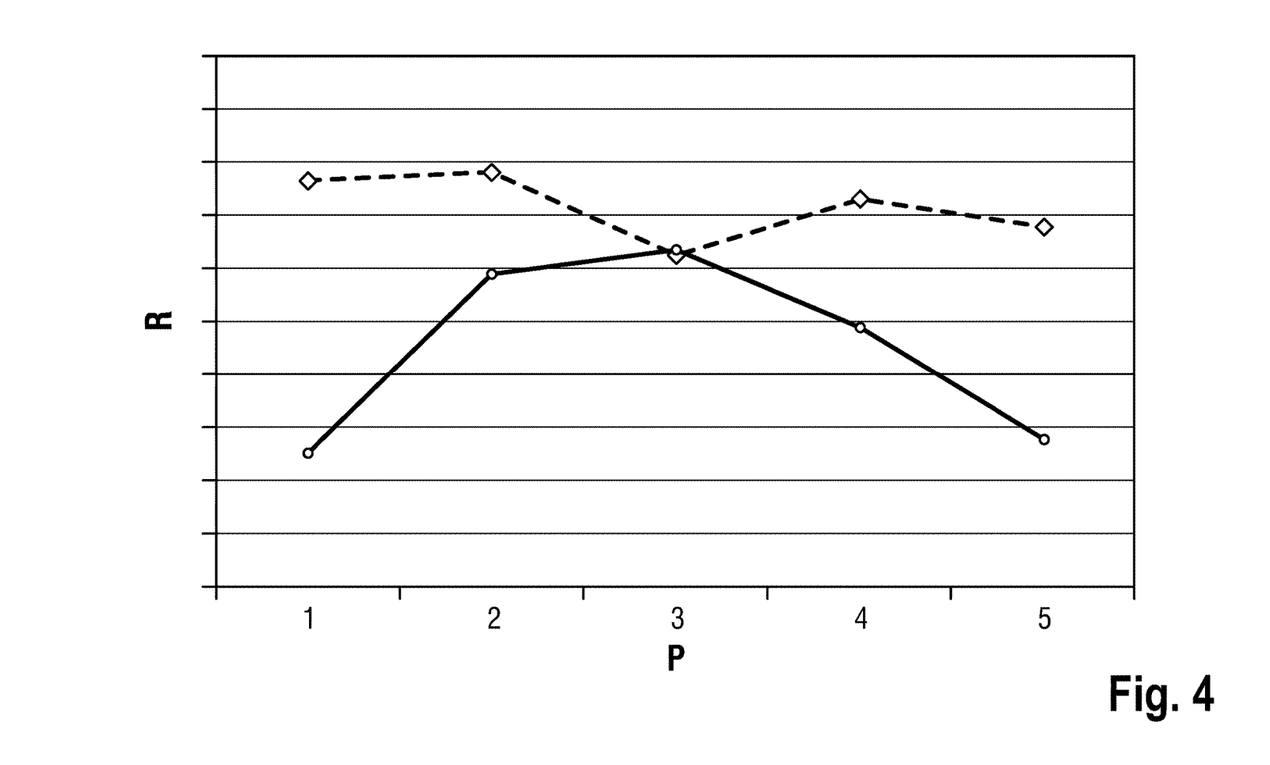
FIG. 4 shows the radial profile of resistivity of a layer of silicon deposited epitaxially on a silicon wafer on the basis of an example and a comparative example.

FIG. 4 shows the radial profile of the resistivity of a layer of silicon deposited epitaxially on a silicon wafer on the basis of an example and a comparative example. The illustration shows in each case the radial position P of five measurement points and the associated resistivities R along the diameter of the silicon wafer. The measurement points depicted in circular fashion represent a silicon wafer in accordance with a comparative example which had been coated in an apparatus without a spacer according to the invention. The radial profile of the resistivity exhibits a distinct asymmetry and falls significantly in the edge region of the silicon wafer in comparison with the center region of the silicon wafer. As shown by the measurement points depicted in rhomboidal fashion, by contrast, the radial profile of the resistivity of the epitaxially deposited layer of a semiconductor wafer in accordance with the invention was almost symmetrical and almost uniform. The silicon wafer in accordance with the invention had been coated under the same process conditions as the silicon wafer of the comparative example, but in an apparatus comprising a spacer according to the invention.

Figure 5:
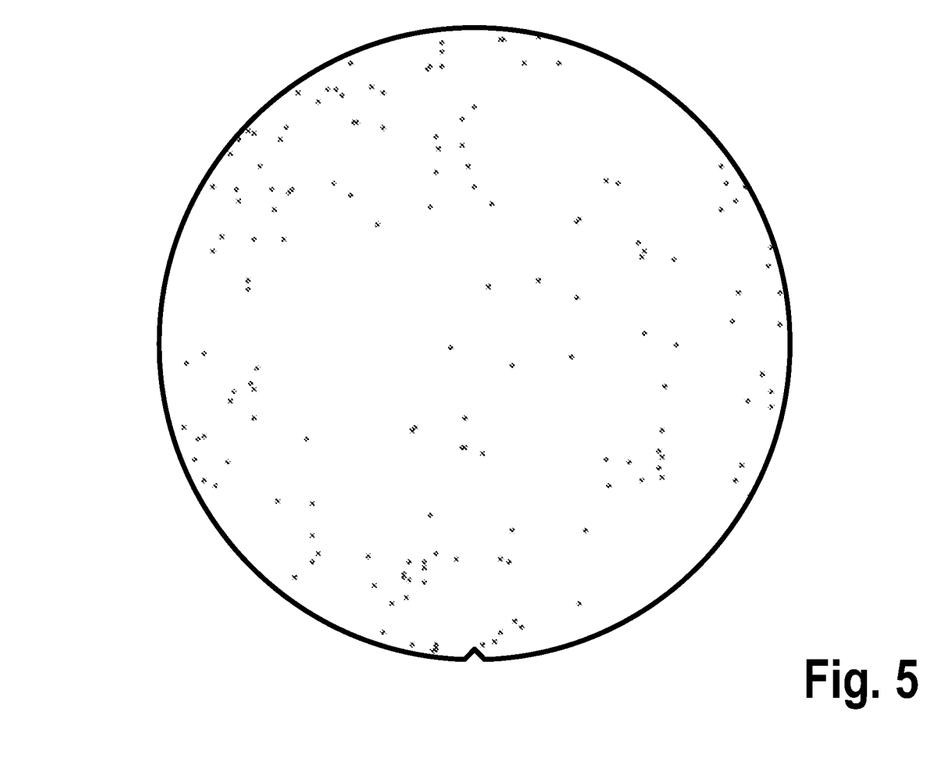
FIG. 5 and FIG. 6 show the result of particle measurements that were performed on silicon wafers with an epitaxially deposited layer of silicon.
Figure 6:
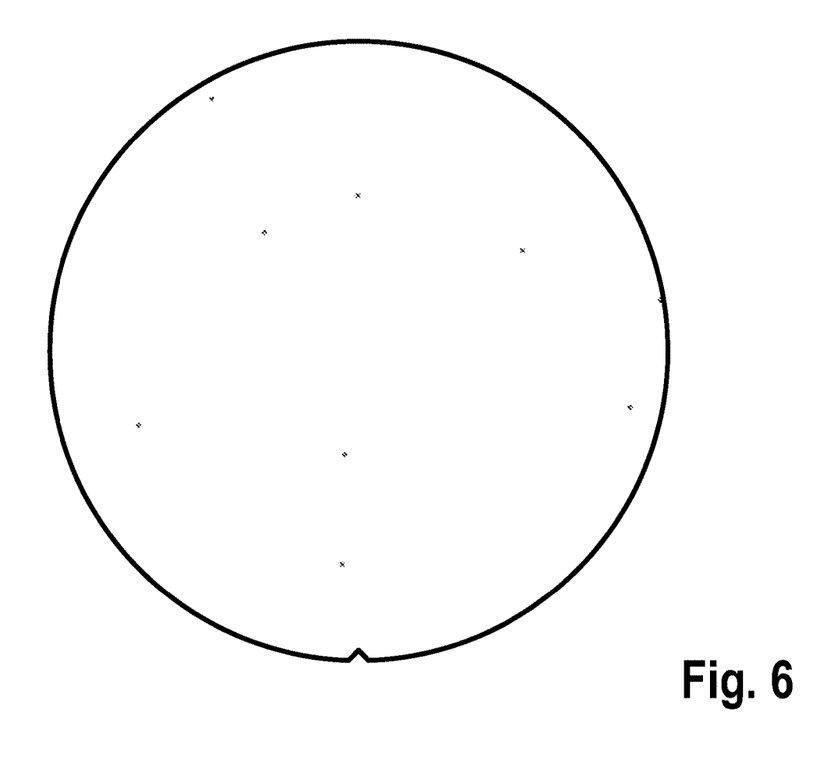

FIG. 5 and FIG. 6 show the result of particle measurements that were performed on silicon wafers with an epitaxially deposited layer composed of silicon. The illustrations show maps which in combination show the positions of particles that were detected by scattered light measurements on, in each case, 25 silicon wafers coated in accordance with the comparative example and the example. The silicon wafers in accordance with the invention (FIG. 6) were contaminated with particles to a significantly lesser extent and exhibited no accumulation of particles in the edge region adjoining the preheating ring like the silicon wafers of the comparative example (FIG. 5).

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. An apparatus for depositing a material layer originating from process gas on a substrate wafer, comprising
    a reactor chamber, which is delimited by an upper dome and a lower dome and a side wall;
    a rotatable susceptor for holding the substrate wafer during deposition of the material layer;
    a preheating ring surrounding the susceptor, the preheating ring having a circular central opening within which the rotatable susceptor rotates;
    a liner, on which the preheating ring is supported in a centered position wherein a gap D having a uniform width is present between the preheating ring and the susceptor; and
    a spacer between the liner and the preheating ring, the spacer keeping the preheating ring in a centered position and providing a vertical distance Δ between the preheating ring and the liner, the spacer comprising balls embedded partly in recesses in the preheating ring and partly in the liner, which enable a relative radial movement between the preheating ring and the liner due to thermal expansion, each ball lying in a elongated recess extending in a radial direction.

2. The apparatus of claim 1, wherein the gap D has a uniform width of not less than 0.1 mm and not more than 2 mm.

3. The apparatus of claim 1, wherein the distance between an outer lateral boundary of the preheating ring and an inner lateral boundary of the liner proximate the outer lateral boundary of the preheating ring is not less than 0.1 mm and not more than 1.9 mm.

4. The apparatus of claim 2, wherein the distance between an outer lateral boundary of the preheating ring and an inner lateral boundary of the liner proximate the outer lateral boundary of the preheating ring is not less than 0.1 mm and not more than 1.9 mm.

5. The apparatus of claim 1, wherein the vertical distance Δ between the preheating ring and the liner, in a region adjoining the spacer is not less than 0.01 mm and not more than 2 mm.

6. The apparatus of claim 2, wherein the vertical distance Δ between the preheating ring and the liner, in a region adjoining the spacer is not less than 0.01 mm and not more than 2 mm.

7. The apparatus of claim 3, wherein the vertical distance Δ between the preheating ring and the liner, in a region adjoining the spacer is not less than 0.01 mm and not more than 2 mm.

8. The apparatus of claim 4, wherein the vertical distance Δ between the preheating ring and the liner, in a region adjoining the spacer is not less than 0.01 mm and not more than 2 mm.

9. The apparatus of claim 1, wherein the balls are embedded in the preheating ring and in the liner such that the balls are enabled to move in a radial direction with respect to the center of the susceptor.

10. The apparatus of claim 1, wherein the balls are located in elongated recesses in the liner which extend radially from a geometric center of the liner.

11. The apparatus of claim 1, wherein the balls are located in elongated recesses in the preheating ring which extend radially from a geometric center of the preheating ring.

12. The apparatus of claim 10, wherein the balls are located in elongated recesses in the preheating ring which extend radially from a geometric center of the preheating ring.

13. A method for depositing a material layer originating from process gas on a substrate wafer, comprising
    directing the process gas over a preheating ring to a substrate wafer held by a rotating susceptor, in an apparatus of claim 1.

14. The method of claim 13, wherein the substrate wafer is held during deposition in a centered position in which a gap D is present between the preheating ring and the susceptor, the gap D having a uniform width of not less than 0.1 mm and not more than 2 mm.

15. A method for depositing a material layer originating from process gas on a substrate wafer, comprising
    directing the process gas over a preheating ring to a substrate wafer held by a rotating susceptor, in an apparatus of claim 2.

16. A method for depositing a material layer originating from process gas on a substrate wafer, comprising
    directing the process gas over a preheating ring to a substrate wafer held by a rotating susceptor, in an apparatus of claim 3.

* * * * *